(12) United States Patent
Chan et al.

(10) Patent No.: US 6,425,114 B1
(45) Date of Patent: Jul. 23, 2002

(54) SYSTEMATIC SKEW REDUCTION THROUGH BUFFER RESIZING

(75) Inventors: Chun Chan; Bing Yi, both of Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/494,605

(22) Filed: Jan. 31, 2000

(51) Int. Cl.[7] ............................................... G06F 17/50
(52) U.S. Cl. ............................................... 716/6; 716/5
(58) Field of Search ................. 716/6, 5, 2, 4

(56) References Cited

U.S. PATENT DOCUMENTS

| | | | |
|---|---|---|---|
| 5,077,676 A | * 12/1991 | Johnson et al. | 716/6 |
| 5,912,820 A | * 6/1999 | Kerzman et al. | 716/6 |
| 5,974,245 A | * 10/1999 | Li et al. | 716/10 |
| 6,087,868 A | * 7/2000 | Millar | 327/156 |

OTHER PUBLICATIONS

Vittal et al, "Low–Power Buffered Clock Tree Design," IEEE, Sep. 1997, pp. 965–975.*
Balboni et al, "Clock Skew Reduction In Asic Logic Design: A Methodology For Clock Tree Management," IEEE, Apr. 1998, pp. 344–356.*
Kourtev et al, "Synthesis Of Clock Tree Topologies To Implement Nonzero Clock Skew Schedule," IEEE, Dec. 1999, pp. 321–326.*
Ryoo et al, "Skew Optimization By Combining Tree–Based And Graph–Based Technique For High Performance Clock Routing," IEEE, Oct. 1999, pp. 407–410.*

* cited by examiner

*Primary Examiner*—Vuthe Siek
(74) *Attorney, Agent, or Firm*—Mitchell, Silberberg & Knupp LLP

(57) ABSTRACT

Skew is reduced in a tree-shaped distribution network having plural levels and plural nodes at each level, where a node at one level connects to plural nodes at the next lower level. Initially, the current level is set to the bottom level of the network. Delay ranges are then obtained corresponding to nodes at the current level and the delay ranges are shifted in an attempt to align delay ranges corresponding to nodes at the current level that connect to the same node at the next higher level. These steps are then repeated for all levels in order from the bottom level to the top level.

22 Claims, 7 Drawing Sheets

SYSTEMATIC SKEW REDUCTION THROUGH BUFFER RESIZING

BACKGROUND OF THE INVENTION

1. Field of the Invention

The present invention concerns skew reduction, and particularly relates to reduction of skew in clock signal distribution during integrated circuit (IC) design.

2. Description of the Related Art

During integrated circuit design, it is often desirable that a certain signal reaches a number of different components at the same time, or at least as close to the same time as possible. The difference between the maximum delay and the minimum delay for a signal to reach different components is known as "skew". The difference between the maximum delay and the minimum delay for a signal to reach all components to which it is supplied is referred to as "global skew".

Controlling skew is particularly important in the design of synchronous digital circuits. Typically, with respect to such circuits, this consideration is most critical for the clock signal, partly because the clock signal is so widely distributed over the surface of the integrated circuit and also because clock skew often will directly influence the maximum speed at which the integrated circuit can operate.

Integrated Circuit Basics

An integrated circuit chip (or die) includes electronic components formed on a surface of a semiconductor substrate and also includes connections between those components.

A cell is a group of one or more circuit elements such as transistors, capacitors, and other basic circuit elements grouped to perform a function. Each of the cells of an IC may have one or more input or output ports (pins). Each such pin, in turn, may be connected to one or more pins of other cells on the IC by electrically conductive traces (or wires). The wires connecting the pins of the IC typically are formed on the metal layers of the chip, which in turn are formed on top of the chip's semiconductor substrate.

A net is a set of two or more pins which are to be connected, thus connecting the logic circuits having the pins. Because a typical chip has thousands, tens of thousands, or hundreds of thousands of pins that must be connected in various combinations, the chip generally also includes definitions of thousands, tens of thousands, or hundreds of thousands of nets, or sets of pins. The number of the nets for a chip is typically on the same order as the order of the number of cells on the chip. Commonly, a majority of the nets include only two pins to be connected; however, many nets include three or more pins. Some nets may include hundreds, thousands or tens of thousands of pins to be connected. A netlist is a list of nets including names of connected pins or a list of cells including names of nets that connect to pins of cells.

The clock signal often is distributed to around 100,000 or more pins. As noted below, because a significant number of buffers typically is required in connection with such distribution, technically speaking clock signal distribution often involves many different nets. Nevertheless, the network for distributing the clock signal is sometimes referred to as the clock net.

Reduction of Clock Signal Skew

Due to the complexity of the clock signal distribution network, it is often very difficult to precisely control the amount of clock skew throughout the IC. Specifically, clock skew typically will be affected by a number of factors, including wire delays, component delays, existence and placement of buffers, and the configuration of the clock net. For example, in order to efficiently distribute the clock signal throughout the IC, it is common to configure the clock signal distribution network as a hierarchical tree, beginning with a single root node that distributes the signal to multiple nodes at the next lower level, each in turn distributing the signal to multiple nodes at the next lower level, and so on, until the signal reaches the actual components (i.e., the leaves of the tree) at the bottom level of the structure. As a result of implementing the clock signal distribution network in this fashion, the delay interrelationships often become even more complicated, making analysis and control of clock skew even more difficult.

In order to maintain the strength of the clock signal as it is distributed throughout the IC, it is common to use buffers. For instance, in the tree-shaped distribution network described above it is common to use a buffer at each node of the tree. In addition to maintaining signal strength, the parameters of these buffers often will affect the amount of delay. Generally, higher drive strength buffers will reduce downstream delay more than lower drive strength buffers. However, due to the complexity of the timing interactions in the typical clock signal distribution network, conventionally it has been very difficult to control buffer parameters so as to achieve an optimal or near optimal result.

While it is theoretically possible to perform an exhaustive search over all possible combinations of buffers in a given configuration, such a search generally will be impractical. Accordingly, prior to the present invention it was common for experienced circuit designers to manually replace individual buffers, according to their best judgment, in an attempt to reduce global skew. However, this approach often was time-consuming, provided inconsistent results and relied heavily on the experience of the individual designer. What has long been needed, therefore, is a more systematic technique for reducing skew.

SUMMARY OF THE INVENTION

The present invention addresses the foregoing problems by systematically aligning delay ranges at different levels of a tree-shaped distribution network.

Thus, in one aspect the invention is directed to skew reduction in a tree-shaped distribution network having plural levels and plural nodes at each level, where a node at one level connects to plural nodes at the next lower level. Initially, the current level is set to the bottom level of the network. Delay ranges are then obtained corresponding to nodes at the current level and the delay ranges are shifted in an attempt to align delay ranges corresponding to nodes at the current level that connect to the same node at the next higher level. These steps are then repeated for all levels in order from the bottom level to the top level.

In a further aspect, the invention is directed to skew reduction in a tree-shaped distribution network having plural levels and plural nodes at each level, where a node at one level connects to plural nodes at the next lower level. Initially, the current level is set to the bottom level of the network. Delay ranges are then obtained corresponding to nodes at the current level and are shifted in an attempt to align delay ranges corresponding to nodes at the current level that connect to the same node at the next higher level. The foregoing steps are then repeated for plural nodes (preferably, all nodes) at the next higher level. Finally, all of the foregoing steps are repeated for all levels in order from the bottom level to the top level.

By aligning delay ranges in the foregoing manner, the present invention often can achieve a significant reduction in skew in a relatively short amount of time and without requiring the user to have any special expertise.

The foregoing summary is intended merely to provide a brief description of the general nature of the invention. A more complete understanding of the invention can be obtained by referring to the claims and the following detailed description of the preferred embodiments in connection with the accompanying figures.

DETAILED DESCRIPTION OF THE PREFERRED EMBODIMENTS

Figure 1:
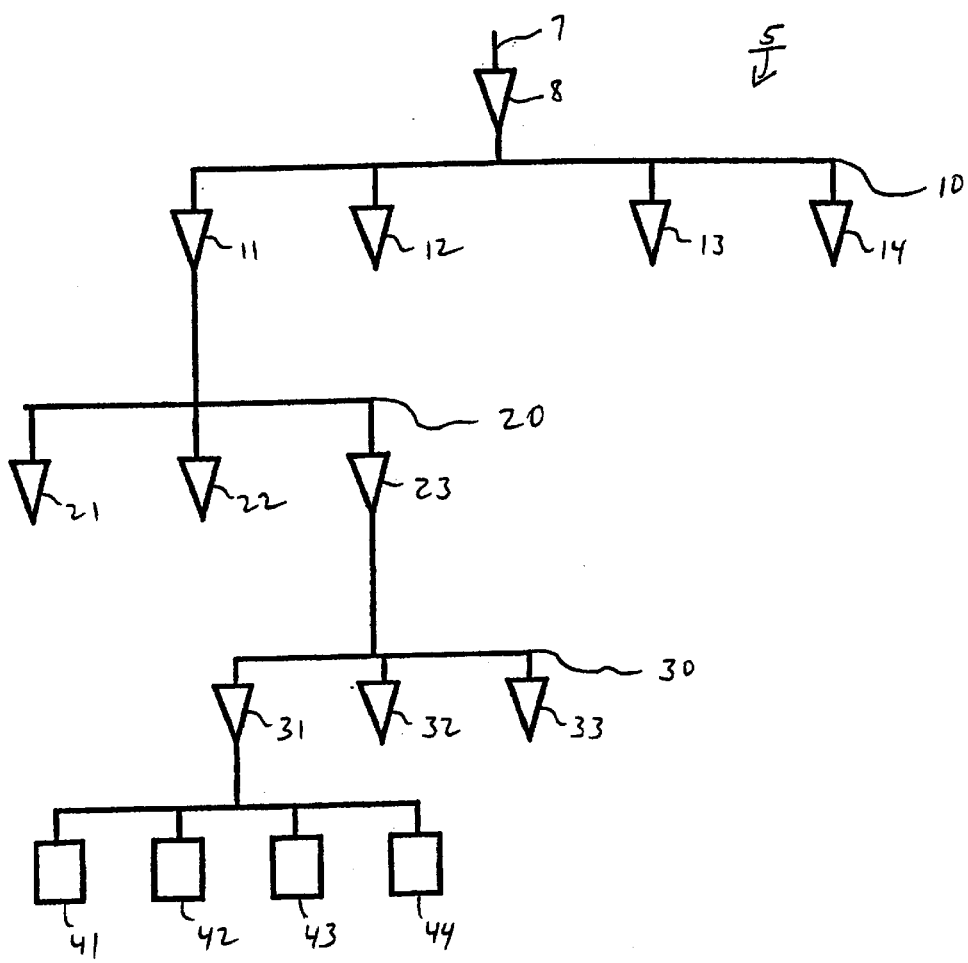
FIG. 1 is a block diagram illustrating a tree-shaped clock signal distribution network according to a representative embodiment of the invention.

FIG. 1 illustrates an exemplary clock signal distribution network 5 which has been specified during IC design. As shown in FIG. 1, network 5 is tree-shaped, having multiple levels, such as levels 10, 20 and 30. A clock signal 7 initially is input into buffer 8, and the output of buffer 8 is connected to the inputs of buffers 11 through 14 in level 10. The output of buffer 11 is then connected to the inputs of buffers 21 though 23 in level 20. Although not shown in FIG. 1 for simplicity of illustration, it should be understood that the outputs of buffers 12 through 14 also are connected to the inputs of other buffers in level 20. The outputs of buffers 21 through 23 are then connected to the inputs of buffers in level 30. For example, the output of buffer 23 is connected to the inputs of buffers 31 to 33 in level 30. This configuration can repeat down to as many levels as is necessary. At the bottom level of the tree-shaped structure, the outputs of the buffers are connected to various terminal loads, such as flip-flops. Thus, for example, the output of buffer 31 connects to flip-flops 41 through 44.

It is noted that a buffer is placed at each node (other than nodes in the terminal load level) of the tree-shaped structure 5 shown in FIG. 1. Although this generally will be the case, it should be understood that nodes may also be included within the distribution network without a corresponding buffer. Throughout this specification, the reference numbers such as 11 and 23 will be used to refer either to the labeled node or to the buffer located at that node, as the context indicates.

Once the distribution network 5 has been specified, (i.e., the individual buffers specified and the loads identified), it generally will be possible to calculate the global clock skew. After doing so, it often will be desirable to attempt to improve the global clock skew by replacing one or more of the buffers in the network 5. In this regard, it is noted that for each buffer position (i.e., node) in network 5, there generally will be available a number of different buffers which may be utilized in that position. For purposes of the present invention, the most significant differences between such available buffers will be the drive strengths associated with such buffers. As used herein, a "larger" buffer will mean a buffer with a greater drive strength and a "smaller" buffer will mean a buffer with a lower drive strength.

Attempting to improve clock skew by swapping buffers, however, often may result in unpredicted consequences. This is due in large part to the inter-relationships between the loads on the various tree nodes that arise out of this structure. The following technique therefore provides a systematic method for replacing buffers in order to minimize clock skew.

Skew Reduction

Figure 2:
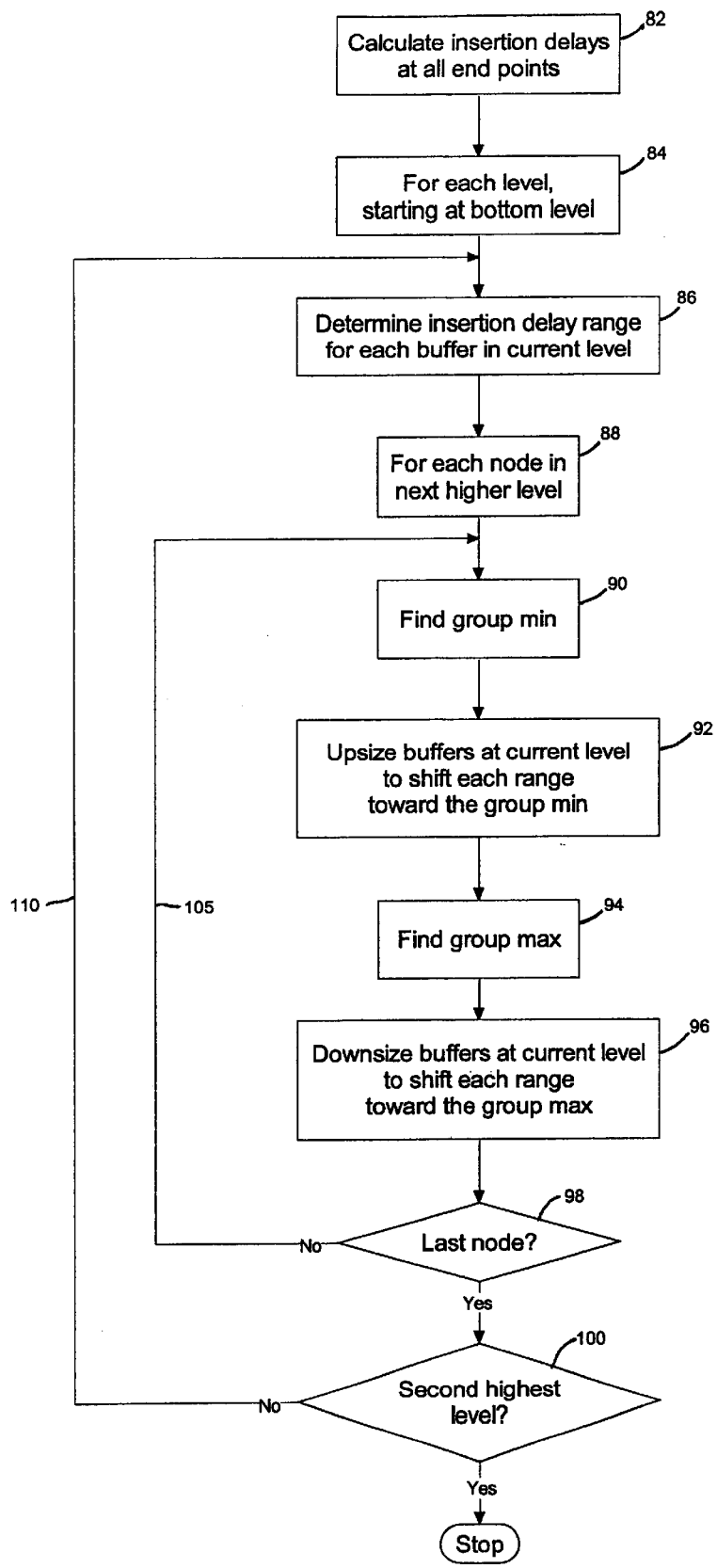
FIG. 2 is a flow diagram illustrating a systematic method for resizing buffers to minimize clock skew according to a representative embodiment of the invention.

FIG. 2 illustrates a flow diagram for explaining skew reduction according to a representative embodiment of the invention. Specifically, the method illustrated in FIG. 2 is applicable to a tree-shaped distribution network, such as network 5 shown in FIG. 1. Briefly, according to FIG. 2: insertion delays are calculated at all end points of the network (i.e., leaves of the tree); the delay range (i.e., minimum to maximum delay) is determined for each buffer in the current level; the buffers in the current level are grouped according to which buffer they connect to in the next higher level; based on such groupings, the group minimum is determined; buffers are upsized at the current level to shift each range towards the group minimum; the group maximum is then determined; and buffers are downsized at the current level to shift each range toward the group maximum; the foregoing steps are then repeated for each buffer in the next higher level; and, finally, the foregoing steps are repeated for each level in the tree-shaped distribution network in order from the bottom level to the top level.

In more detail, in step 82 insertion delays are calculated at all end points (i.e., leaves of the tree). For example, referring to FIG. 1, delays would be calculated for each of elements 41 through 44 and for all other terminal elements not explicitly shown in FIG. 1. These insertion delays may constitute a range between the minimum expected delay and the maximum expected delay. However, more likely such delays would be expressed as a single value. If layout and routing have already been performed, these delays can be calculated from the selected components, the routing distances and the other routing characteristics. Otherwise, it is possible to assume certain delay ranges based on the technology involved. Typically, at least some of the physical design characteristics will not be completely known, thus requiring at least some assumptions.

In step 84, the current level is initialized to the bottom level of the distribution network. With respect to the distribution network shown in FIG. 1, this would be level 30. Loop 110 is repeated for each level of the distribution network, progressing sequentially from the bottom level to the top level.

In step 86, the insertion delay range for each buffer at the current level is determined. It is noted that this delay typically will be a function of the delays and delay ranges downstream from such buffer, the routing between the buffer and the insertion point to the elements below the buffer, the drive strength of the buffer and the delay of the buffer itself. The most significant factors in determining the insertion delay range for a buffer at the current level typically will be the drive strength of the buffer and the delays and/or delay ranges for buffers and/or components directly connected to the output of such buffer. More specifically, the insertion delay range for the buffer often will be largely determined as the range between the minimum and maximum delays for all buffers and/or components directly connected to the output of the buffer, with the entire range shifted (and, possibly, some relatively small compression or expansion) based on the subject buffer's drive strength, and with relatively smaller adjustments for the other factors described above. Because the delay range for each buffer directly connected to the output of the subject buffer will in turn have been determined based on the delays and delay ranges for all components and/or buffers directly connected to their outputs, and so on, the delay range for the buffer currently being analyzed will in fact be based on all downstream delays and delay ranges. Referring again to FIG. 1, and assuming the process currently is at level 30, the insertion delay ranges for each of buffers 31, 32 and 33, as well as for all other buffers at level 30 which are not shown in FIG. 1, would be determined in this step.

In step 88, an initial node in the next higher level is identified. Referring again to FIG. 1, this node may, for example, be node 23. Loop 105 is repeated for each such node in the next higher level.

In step 90, all nodes in the current level that connect to the identified node in the next higher level are defined as a group. The minimum insertion delay among this group of nodes is then identified. For example, referring again to FIG. 1, if node 23 is the selected node in the next higher level, then the group of nodes would consist of nodes 31 to 33, and the minimum insertion delay for these three nodes would be determined in this step.

In step 92, the buffer at each node of the current level is upsized so as to shift the corresponding insertion delay range toward the group minimum. Preferably, each such insertion delay range is shifted so that its minimum is as close as possible to, but not below, the group minimum identified in step 90. The preferred implementation of this step is described in more detail below in connection with the flow diagram shown in FIG. 3.

In step 94, the maximum insertion delay among all the buffers in the group of nodes identified in step 90 is determined. Specifically, this step 94 looks at the insertion delay ranges for those buffers after such delay ranges were shifted in step 92.

In step 96, the buffer at each node of the current level is downsized so as to shift the corresponding insertion delay range toward the group maximum. Preferably, each such insertion delay range is shifted so that its maximum is as close as possible to, but not above, the group maximum identified in step 90. The preferred implementation of this step is described in more detail below in connection with the flow diagram shown in FIG. 4.

In step 98, it is determined whether the current node in the next higher level is the last node to be processed. If it is not, then processing returns to step 90 to begin processing for the next node in the next higher level. If it is, then processing proceeds to step 100.

In step 100, it is determined whether the current level is the second highest level (i.e., the level just below the root node). With respect to FIG. 1, this would be level 10. If the current level is not the second highest level, then processing returns to step 86 to begin processing the next higher (i.e., the "current level" is set to the next higher level). If the current level is the second highest level, then processing is completed.

Figure 3:
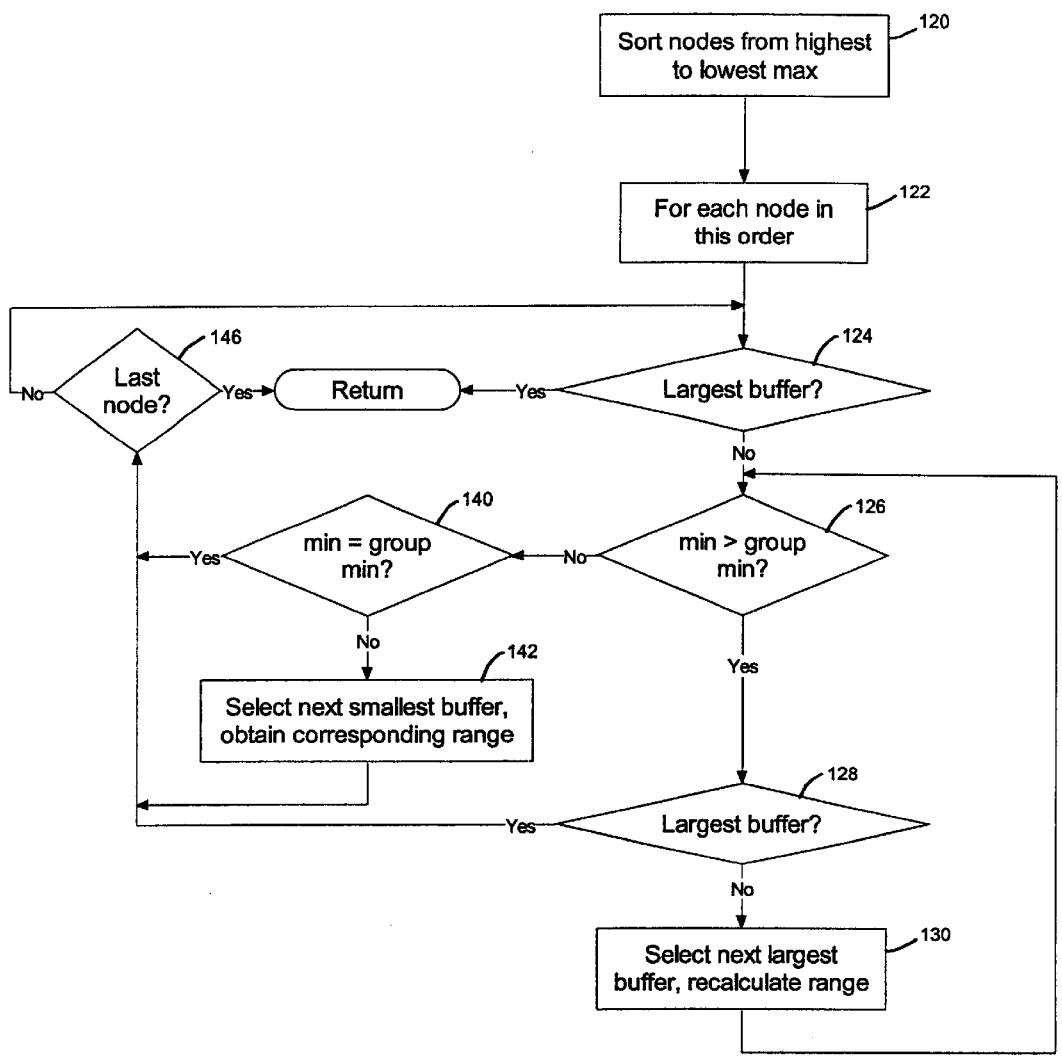
FIG. 3 is a flow diagram for explaining the buffer-upsizing pass of the method shown in FIG. 2.

FIG. 3 illustrates processing steps for performing step 92 (shown in FIG. 2) according the preferred embodiment of the invention. Briefly, according to FIG. 3, the buffers that are connected to the current node in the next higher level are examined and the insertion delay ranges corresponding to those buffers are sorted in order from those having highest to lowest maximum delay; then, for each such range the entire range is shifted toward lower delays by increasing the drive strength of the buffer corresponding to such range, one step at a time, until either the maximum drive strength buffer has been selected or until the minimum insertion delay for the node is lower than the minimum for the group identified in step 90 of FIG. 2; in the event that this latter point is reached, the next smallest buffer is selected in order to back up to a point where the minimum insertion delay for the node is equal to or just above the group minimum; if at any time, initial examination of a node indicates that the largest buffer is already being used for that node, then processing for step 92 immediately ceases.

In more detail, in step 120 the nodes connected to the current node in the next higher level (which was selected in step 88 of FIG. 2) and their corresponding insertion delay ranges are sorted in order from the node having the highest to the node having the lowest maximum insertion delay.

In step 122, the first node at the current level (according to the order identified in step 120) and its corresponding insertion delay range are selected for processing.

In step 124, it is determined whether the buffer for the current node (at the current level) is the largest available buffer for that position. If it is not, then processing proceeds to step 126. If it is, then step 92 is completed and processing proceeds to step 94 (shown in FIG. 2). It is noted that in this latter case, because the nodes at the current level have been sorted in step 120, the inability to shift the current insertion delay range toward lower delay values means that the maximum delay in the current insertion delay range is the best that can be obtained with respect to the current node in the next higher level.

In step 126, it is determined whether the minimum delay for the current node of the current level is greater than the group minimum identified in step 90 (shown in FIG. 2). If it is, then processing proceeds to step 128. If it is not, then processing proceeds to step 140.

In step 128, it is determined whether the buffer at the current node of the current level is the largest buffer available for that position. If it is, then no further shifting is possible for the current node in the current level; accordingly, processing proceeds to step 146. Otherwise, processing proceeds to step 130.

In step 130, the next largest available buffer is selected for the current node of the current level. Also, using the characteristics of this new buffer, the insertion delay range is recalculated for the current node of the current level, and then processing returns to step 126.

In step 140, it is determined whether the minimum insertion delay for the current node of the current level is equal to the group minimum identified in step 90 (shown in FIG. 2). If it is, then no further improvement is possible for the current node of the current level and processing proceeds to step 146. If it is not, then the minimum insertion delay for the current node of the current level must be less than the group minimum, and so processing proceeds to step 142.

In step 142, the next smallest buffer is selected for the current node of the current level. It is noted that in this case, the insertion delay range for the current node of the current level has just been shifted too far to the left, and therefore the immediately previous buffer must have resulted in a minimum insertion delay value for the current node of the current level which is closest to the group minimum without being below the group minimum. Also in this step, the insertion delay range is obtained for this new buffer selection. Typically, such insertion delay range will already be known because it would have corresponded to the last buffer tested prior to the current buffer selection. Moreover, in the preferred embodiment of the invention, the insertion delay range that corresponds to a currently selected buffer is stored just prior to selecting the next larger buffer size. Accordingly, rather than having to recalculate the "new" insertion delay range, this step can merely retrieve it from memory.

In step 146, it is determined whether the current node of the current level is the last node connected to the current node in the next higher level. If it is, then the processing of step 92 is completed and processing proceeds to step 94 (shown in FIG. 2). Otherwise, the next node in the current level (according to the order identified in step 120) that is connected to the current node in the next higher level is selected, and processing returns to step 124 to process this node.

Figure 4:
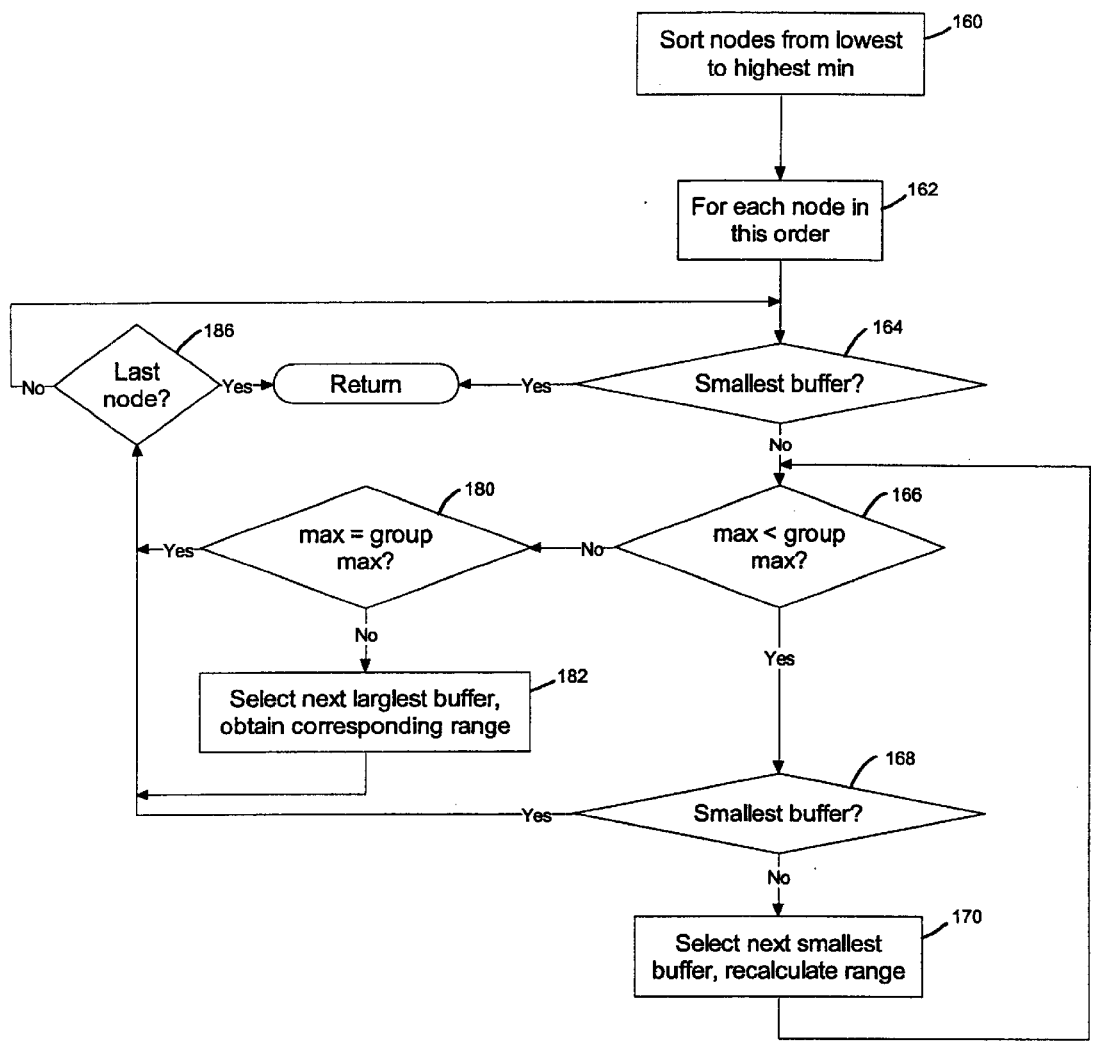
FIG. 4 is a flow diagram for explaining the buffer-downsizing pass of the method illustrated in FIG. 2.

FIG. 4 illustrates processing steps for performing step 96 (shown in FIG. 2) according the preferred embodiment of the invention. As will become apparent below, the preferred processing steps for step 96 are very similar to the preferred processing steps for step 92.

Briefly, according to FIG. 4, the buffers that are connected to the current node in the next higher level are examined and the insertion delay ranges corresponding to those buffers are sorted in order from those having lowest to highest minimum delay; then, for each such range the entire range is shifted toward higher delays by decreasing the drive strength of the buffer corresponding to such range, one step at a time, until either the minimum drive strength buffer has been selected or until the maximum insertion delay for the node is higher than the maximum for the group identified in step 94 of FIG. 2; in the event that this latter point is reached, the next largest buffer is selected in order to back up to a point where the maximum insertion delay for the node is equal to or just below the group maximum; if at any time, initial examination of a node indicates that the smallest buffer is already being used for that node, then processing for step 96 immediately ceases.

In more detail, in step 160 the nodes connected to the current node in the next higher level (which was selected in step 88 of FIG. 2) and their corresponding insertion delay ranges are sorted in order from the node having the lowest to the node having the highest minimum insertion delay.

In step 162, the first node at the current level (according to the order identified in step 160) and its corresponding insertion delay range are selected for processing.

In step 164, it is determined whether the buffer for the current node (at the current level) is the smallest available buffer for that position. If it is not, then processing proceeds to step 166. If it is, then step 96 is completed and processing proceeds to step 98 (shown in FIG. 2). It is noted that in this latter case, because the nodes at the current level have been sorted in step 160, the inability to shift the current insertion delay range toward higher delay values means that the minimum delay in the current insertion delay range is the best that can be obtained with respect to the current node in the next higher level.

In step 166, it is determined whether the maximum delay for the current node of the current level is less than the group maximum identified in step 94 (shown in FIG. 2). If it is, then processing proceeds to step 168. If it is not, then processing proceeds to step 180.

In step 168, it is determined whether the buffer at the current node of the current level is the smallest buffer available for that position. If it is, then no further shifting is possible for the current node in the current level; accordingly, processing proceeds to step 186. Otherwise, processing proceeds to step 170.

In step 170, the next smallest available buffer is selected for the current node of the current level. Also, using the characteristics of this new buffer, the insertion delay range is recalculated for the current node of the current level, and then processing returns to step 166.

In step 180, it is determined whether the maximum insertion delay for the current node of the current level is equal to the group maximum identified in step 94 (shown in FIG. 2). If it is, then no further improvement is possible for the current node of the current level and processing proceeds to step 186. If it is not, then the maximum insertion delay for the current node of the current level must be greater than the group maximum, and so processing proceeds to step 182.

In step 182, the next largest buffer is selected for the current node of the current level. It is noted that in this case, the insertion delay range for the current node of the current level has just been shifted too far to the right, and therefore the immediately previous buffer must have resulted in a maximum insertion delay value for the current node of the current level which is closest to the group maximum without being above the group maximum. Also in this step, the insertion delay range is obtained for this new buffer selection. Typically, such insertion delay range will already be known because it would have corresponded to the last buffer tested prior to the current buffer selection. Moreover, in the preferred embodiment of the invention, the insertion delay range that corresponds to a currently selected buffer is stored just prior to selecting the next smaller buffer size. Accordingly, rather than having to recalculate the "new" insertion delay range, this step can merely retrieve it from memory.

In step 186, it is determined whether the current node of the current level is the last node connected to the current node in the next higher level. If it is, then the processing of step 96 is completed and processing proceeds to step 98 (shown in FIG. 2). Otherwise, the next node in the current level (according to the order identified in step 160) that is connected to the current node in the next higher level is selected, and processing returns to step 164 to process this node.

Sample Problem

Figure 5:
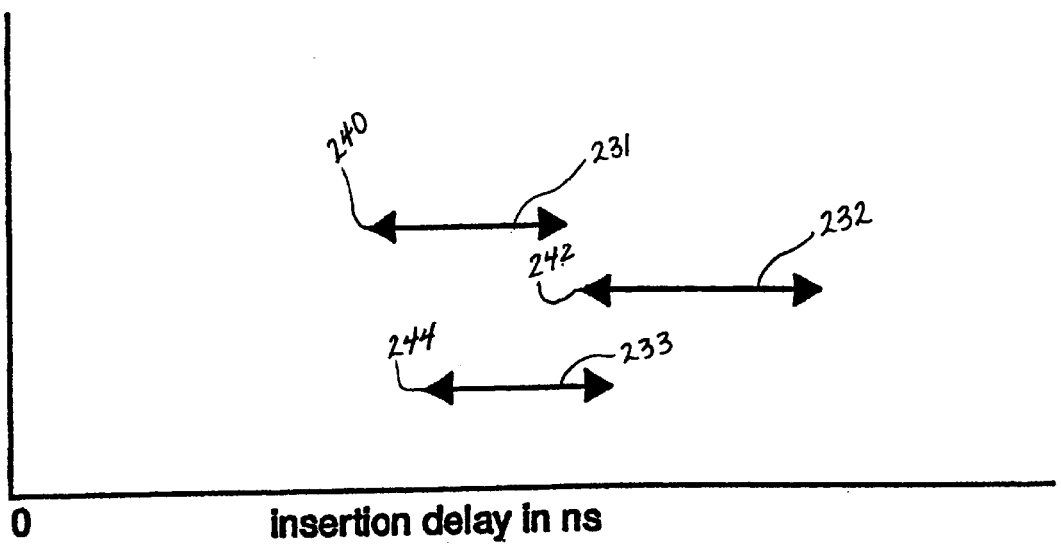
FIG. 5 illustrates a group of delay ranges corresponding to one node of a tree-shaped distribution network.

The following sample problem illustrates the technique of the present invention shown in FIGS. 2 to 4. Referring again to distribution network 5 (shown in FIG. 1), the process begins by calculating the insertion delays at all end points of the network, e.g., elements 41 to 44 (step 82). Based on these insertion delays, an insertion delay range is calculated for buffer 31 (step 86). This insertion delay range is illustrated as range 231 in FIG. 5. In a similar manner, insertion delay ranges 232 and 233 are calculated (step 86) for buffers 32 and 33, respectively. The insertion delay ranges 231 to 233 correspond to the nodes 31 to 33 that connect to node 23 in the next higher level 20. From this group, the minimum insertion delay 240 is identified (step 90).

Figure 6A:
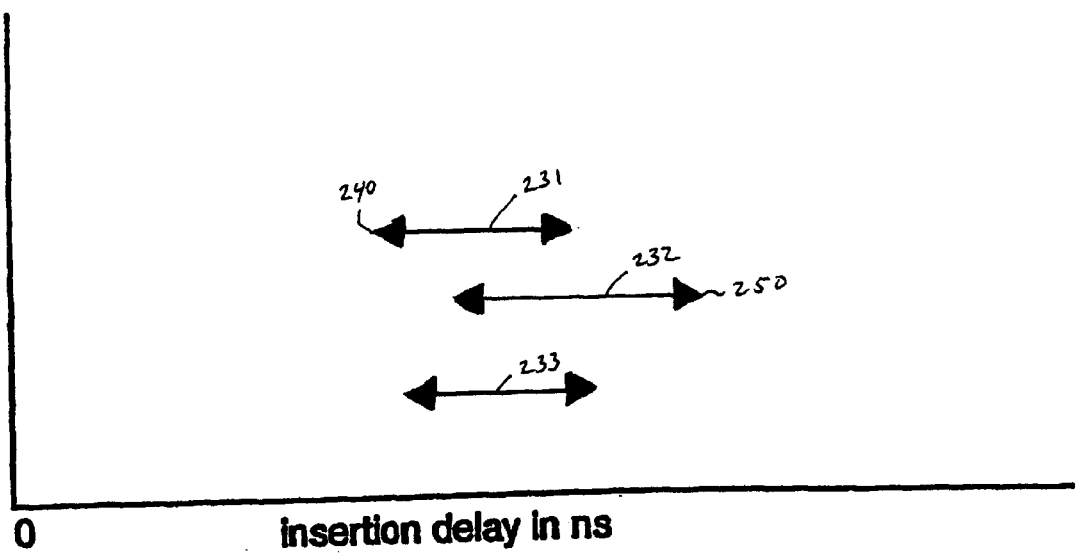
FIGS. 6A and 6B illustrate the processing of the delay ranges shown in FIG. 5 using the method illustrated in FIG. 2.

Thereafter, the process attempts to shift each insertion delay range leftward toward the minimum insertion delay 240 (step 92). In the preferred embodiment, this shifting is performed in the following manner. The insertion delay ranges are sorted from highest to lowest maximum delay, i.e., in the order of 232, 233 and then 231 (step 120). Starting with the first insertion delay range in this ordered list, 232, the process attempts to shift each delay range toward the minimum 240 by upsizing the corresponding buffer, one step at a time. First, range 232 is shifted so that minimum 242 is as close as possible to minimum 240 without being below minimum 240. Then, range 233 is shifted leftward until minimum 244 is as close as possible to minimum 240 without being below minimum 240. The resulting situation is illustrated in FIG. 6A.

Figure 6B:
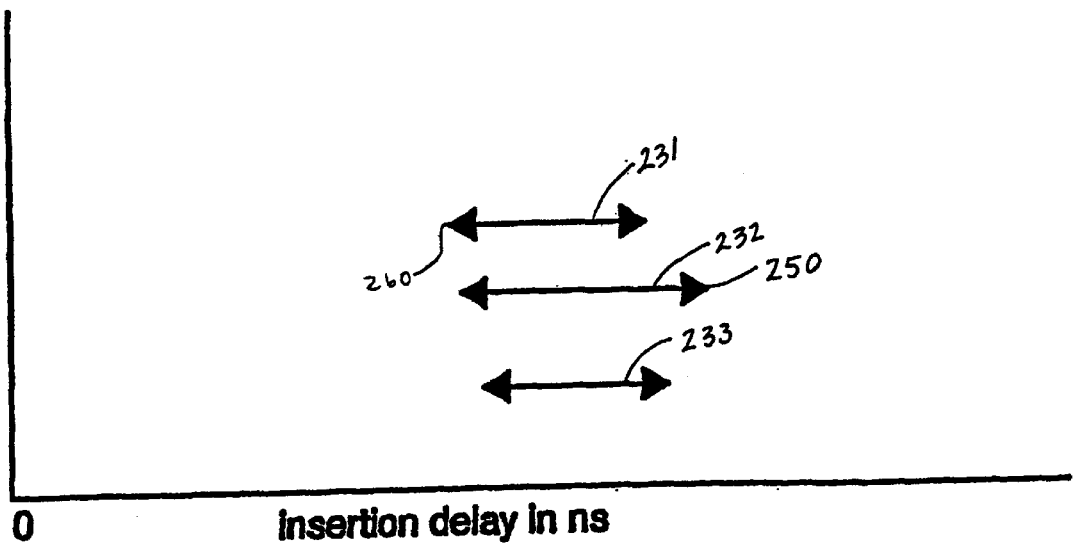

Thereafter, the maximum insertion delay 250 for the group (shown in FIG. 6A) is identified (step 94). Finally, the process attempts to shift each of the delay ranges 231 to 233 shown in FIG. 6 so that its maximum insertion delay is as close as possible to, but not above, maximum 250 (step 96). The results of this operation are illustrated in FIG. 6C. A similar procedure is then repeated (loop 105) for each of nodes 21 and 22 of the next higher level. Upon completion of loop 105, the next higher level (i.e., level 20) is set to the current level and the process repeats. In this regard, it is noted that the insertion delay range for node 23 (when processing the group of nodes connected to node 11) will be based on the delay range for the group shown in FIG. 6B, i.e., group minimum 260 to group maximum 250.

By continuing the processing in the foregoing manner, a significant reduction in clock skew generally will be obtained. Moreover, such a reduction generally can be obtained without any expertise on the part of the designer and in a quick and efficient manner.

Design System Environment

Figure 7:
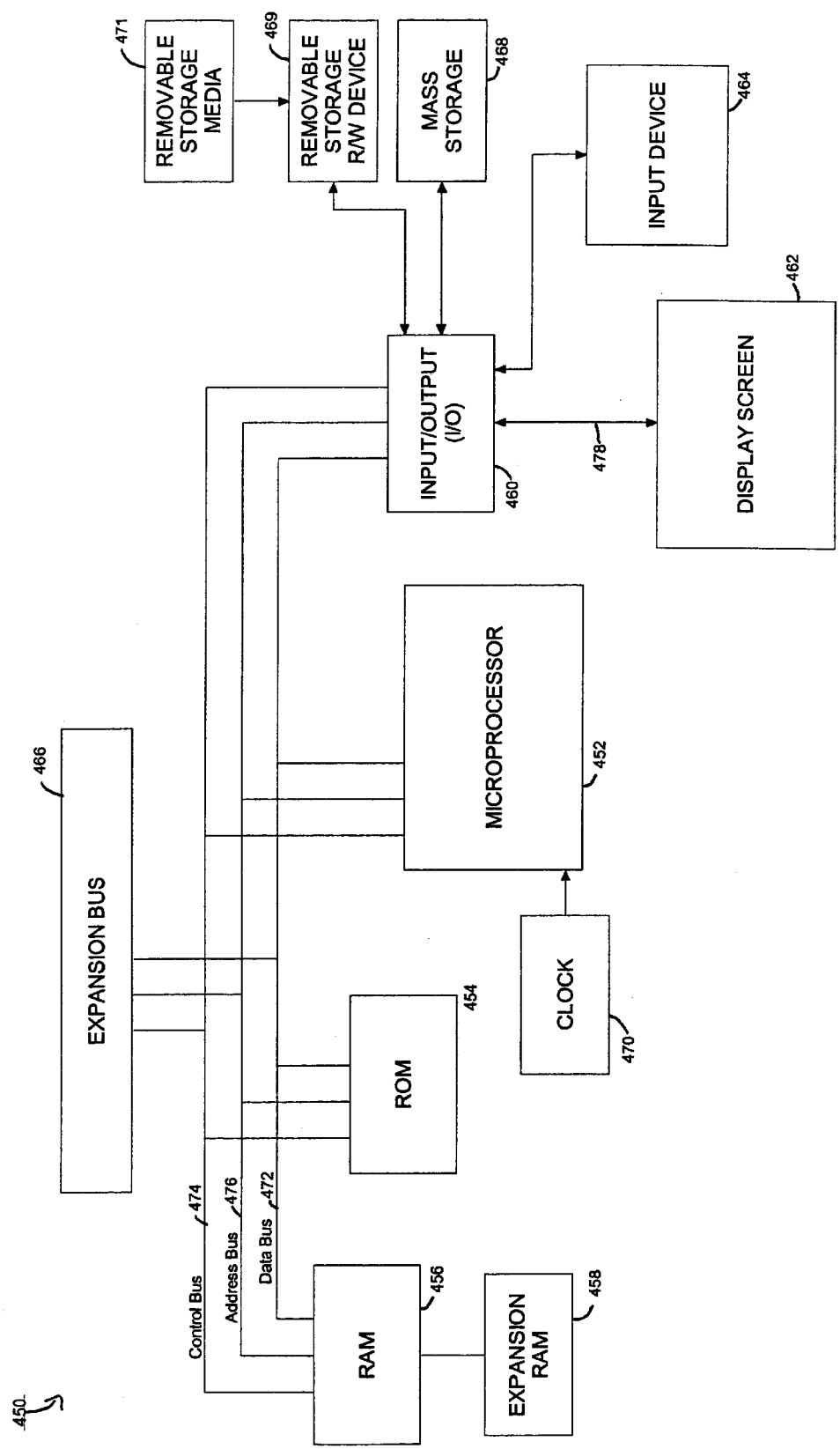
FIG. 7 is a block diagram of a general purpose computer system, representing one suitable computer platform for implementing the methods of the invention.

Generally, the methods described herein with respect to IC design will be practiced with a general purpose computer, either with a single processor or multiple processors. FIG. 7 is a block diagram of a general purpose computer system, representing one of many suitable computer platforms for implementing the methods described above. FIG. 7 shows a general purpose computer system 450 in accordance with the present invention. As shown in FIG. 7, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform the steps of the inventive method described above, stored in ROM 454 and/or RAM 456. It is noted that such process steps may initially be stored in mass storage 468, downloaded into RAM 456 and then executed out of RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media include, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

CONCLUSION

The present invention provides systematic techniques for reducing skew in a signal distribution network. Typically, such techniques will be applied to distribution of the clock signal. However, they also may be applied to any other signal where skew is a consideration. Although such techniques are applied in the above embodiments to reduce global skew, it should be understood that they also may be applied to only a portion of a distribution network to reduce skew in specific portions of the circuit only. For example, they may be applied only to critical portions of the circuit.

In the preferred embodiment of the invention, such techniques are implemented in a strict bottom-up fashion.

However, other implementations are possible. For instance, it is possible to back-track to lower levels after processing at higher levels in order to fine-tune the results. For instance, in cases where a larger buffer is not available at one level, it may be possible to go down one level and increase the drive strengths of some or all buffers connected to the output of the subject buffer to achieve the desired delay shift.

Similarly, in the preferred embodiment of the invention the initial group minimum is selected as the "target" minimum toward which all other delay ranges in the group are shifted. However, it should be noted that other "target" minimums may be used instead. For example, it may be preferable to use the absolute minimum delay that is achievable for the group. Alternatively, the "target" minimum may be made to be flexible for each group depending upon previous processing within the tree-shaped structure and/or depending upon a preliminary analysis of the distribution network. In general, the "target" minimum for each group of nodes may be selected based on a number of different design tradeoffs.

Finally, it is noted that although there generally will be a buffer at each node of the distribution network, this is not strictly necessary. Whether a buffer can in fact be omitted at any particular node typically will depend upon the load at such node and the necessity of shifting the corresponding delay range.

Thus, although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Rather, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method for reducing skew in a tree-shaped distribution network having plural levels and plural nodes at each level, wherein a node at one level connects to plural nodes at the next lower level, said method comprising:
   (a) setting a current level to a bottom level of the network;
   (b) obtaining delay ranges corresponding to nodes at the current level;
   (c) shifting said delay ranges in order to align delay ranges corresponding to nodes at the current level that connect to a same node at a next higher level, wherein said step (c) includes steps of:
   (c1) obtaining a group minimum delay;
   (c2) shifting the delay ranges corresponding to nodes at the current level that connect to the same node at the next higher level toward the group minimum;
   (c3) obtaining a group maximum delay upon completion of step (c2); and
   (c4) shifting the delay ranges corresponding to nodes at the current level that connect to the same node at the next higher level toward the group maximum; and
   (d) repeating steps (b)–(c) for all levels in order from the bottom level to the top level.

2. A method according to claim 1, wherein step (c) is performed for all nodes at the next higher level at each iteration of step (d).

3. A method according to claim 1, wherein the delay range corresponding to a node is a range between a minimum delay at said node and a maximum delay at said node.

4. A method according to claim 1, wherein in step (c2) a minimum delay in each delay range is shifted as close as possible but not below the group minimum.

5. A method according to claim 1, wherein in step (c4) a maximum delay in each delay range is shifted as close as possible but not above the group maximum.

6. A method according to claim 1, further comprising a sorting step of sorting the nodes at the current level that connect to the same node at the next higher level based on a maximum delay associated with said nodes, wherein said sorting step is performed prior to step (c2).

7. A method according to claim 1, further comprising a sorting step of sorting the nodes at the current level that connect to the same node at the next higher level based on a minimum delay associated with said nodes, wherein said sorting step is performed prior to step (c4).

8. A method according to claim 7, wherein said sorting step is performed after step (c2).

9. A method according to claim 1, wherein in step (c) the delay ranges are shifted by replacing buffers disposed at the nodes of the current level with different sized buffers.

10. A method according to claim 9, wherein in step (c), after each buffer is replaced, an updated delay range is obtained.

11. A method for reducing skew in a tree-shaped distribution network having plural levels and plural nodes at each level, wherein a node at one level connects to plural nodes at the next lower level, said method comprising:
   (a) setting a current level to a bottom level of the network;
   (b) obtaining delay ranges corresponding to nodes at the current level;
   (c) shifting said delay ranges in order to align delay ranges corresponding to nodes at the current level that connect to a same node at a next higher level, wherein said step (c) includes steps of:
   (c1) obtaining a group minimum delay;
   (c2) shifting the delay ranges corresponding to nodes at the current level that connect to the same node at the next higher level toward the group minimum;
   (c3) obtaining a group maximum delay upon completion of step (c2); and
   (c4) shifting the delay ranges corresponding to nodes at the current level that connect to the same node at the next higher level toward the group maximum;
   (d) repeating step (c) for plural nodes at the next higher level; and
   (e) repeating steps (b)–(d) for all levels in order from the bottom level to the top level.

12. A method according to claim 11, wherein in step (c2) a minimum delay in each delay range is shifted as close as possible but not below the group minimum.

13. A method according to claim 11, wherein in step (c4) a maximum delay in each delay range is shifted as close as possible but not above the group maximum.

14. A method according to claim 11, further comprising a sorting step of sorting the nodes at the current level that connect to the same node at the next higher level based on a maximum delay associated with said nodes, wherein said sorting step is performed prior to step (c2).

15. A method according to claim 11, further comprising a sorting step of sorting the nodes at the current level that connect to the same node at the next higher level based on a minimum delay associated with said nodes, wherein said sorting step is performed prior to step (c4).

16. A method according to claim 15, wherein said sorting step is performed after step (c2).

17. A method according to claim 11, wherein in step (c) the delay ranges are shifted by replacing buffers disposed at the nodes of the current level with different sized buffers.

18. A method according to claim 17, wherein in step (c), after each buffer is replaced, an updated delay range is obtained.

19. A computer-readable medium storing computer-executable process steps for reducing skew in a tree-shaped distribution network having plural levels and plural nodes at each level, wherein a node at one level connects to plural nodes at the next lower level, said process steps comprising steps to:

(a) set a current level to a bottom level of the network;

(b) obtain delay ranges corresponding to nodes at the current level;

(c) shift said delay ranges in order to align delay ranges corresponding to nodes at the current level that connect to a same node at a next higher level, wherein said step (c) includes steps to:

(c1) obtain a group minimum delay;

(c2) shift the delay ranges corresponding to nodes at the current level that connect to the same node at the next higher level toward the group minimum;

(c3) obtain a group maximum delay upon completion of step (c2); and (c4) shift the delay ranges corresponding to nodes at the current level that connect to the same node at the next higher level toward the group maximum; and (d) repeat steps (b)–(c) for all levels in order from the bottom level to the top level.

20. An apparatus for reducing skew in a tree-shaped distribution network having plural levels and plural nodes at each level, wherein a node at one level connects to plural nodes at the next lower level, said apparatus comprising:

a processor for executing stored program instruction steps; and a memory connected to the processor for storing the program instruction steps, wherein the program instruction steps include steps to:

(a) set a current level to a bottom level of the network;

(b) obtain delay ranges corresponding to nodes at the current level;

(c) shift said delay ranges in order to align delay ranges corresponding to nodes at the current level that connect to a same node at a next higher level, wherein said step (c) includes steps to:

(c1) obtain a group minimum delay;

(c2) shift the delay ranges corresponding to nodes at the current level that connect to the same node at the next higher level toward the group minimum;

(c3) obtain a group maximum delay upon completion of step (c2); and (c4) shift the delay ranges corresponding to nodes at the current level that connect to the same node at the next higher level toward the group maximum; and (d) repeat steps (b)–(c) for all levels in order from the bottom level to the top level.

21. An apparatus for reducing skew in a tree-shaped distribution network having plural levels and plural nodes at each level, wherein a node at one level connects to plural nodes at the next lower level, said apparatus comprising:

(a) means for setting a current level to a bottom level of the network;

(b) means for obtaining delay ranges corresponding to nodes at the current level;

(c) means for shifting said delay ranges in order to align delay ranges corresponding to nodes at the current level that connect to a same node at a next higher level, wherein said means (c) includes:

(c1) means for obtaining a group minimum delay;

(c2) means for shifting the delay ranges corresponding to nodes at the current level that connect to the same node at the next higher level toward the group minimum;

(c3) means for obtaining a group maximum delay upon completion of the shifting by said means (c2); and (c4) means for shifting the delay ranges corresponding to nodes at the current level that connect to the same node at the next higher level toward the group maximum; and (d) means for repeating activation of means (b)–(c) for all levels in order from the bottom level to the top level.

22. An apparatus for reducing skew in a tree-shaped distribution network having plural levels and plural nodes at each level, wherein a node at one level connects to plural nodes at the next lower level, said apparatus comprising:

(a) means for setting a current level to a bottom level of the network;

(b) means for obtaining delay ranges corresponding to nodes at the current level;

(c) means for shifting said delay ranges in order to align delay ranges corresponding to nodes at the current level that connect to a same node at a next higher level, wherein said means (c) includes:

(c1) means for obtaining a group minimum delay;

(c2) means for shifting the delay ranges corresponding to nodes at the current level that connect to the same node at the next higher level toward the group minimum;

(c3) means for obtaining a group maximum delay upon completion of the shifting by said means (c2); and (c4) means for shifting the delay ranges corresponding to nodes at the current level that connect to the same node at the next higher level toward the group maximum;

(d) means for repeating activation of said means (c) for plural nodes at the next higher level; and (e) means for repeating activation of said means (b)–(d) for all levels in order from the bottom level to the top level.

* * * * *